United States Patent
Lee et al.

(10) Patent No.: US 8,519,799 B2
(45) Date of Patent: Aug. 27, 2013

(54) VOLTAGE CONTROLLED OSCILLATOR

(75) Inventors: Yeong-Sheng Lee, Fremont, CA (US); George Shing, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 27 days.

(21) Appl. No.: 13/288,608

(22) Filed: Nov. 3, 2011

(65) Prior Publication Data

US 2012/0161886 A1    Jun. 28, 2012

(30) Foreign Application Priority Data

Dec. 24, 2010 (TW) .............................. 99145760 A

(51) Int. Cl.
*H03K 3/03* (2006.01)
(52) U.S. Cl.
USPC ............................................ 331/57; 331/185
(58) Field of Classification Search
USPC ................................................ 331/57, 185
See application file for complete search history.

(56) References Cited

U.S. PATENT DOCUMENTS

| | | | |
|---|---|---|---|
| 5,559,473 A * | 9/1996 | Anderson et al. | 331/34 |
| 7,138,845 B2 | 11/2006 | Lin | |
| 7,193,443 B1 * | 3/2007 | Smith et al. | 326/83 |
| 7,592,877 B2 | 9/2009 | Shiramizu et al. | |
| 8,081,038 B2 * | 12/2011 | Lee et al. | 331/57 |

* cited by examiner

*Primary Examiner* — Joseph Chang
(74) *Attorney, Agent, or Firm* — McClure, Qualey & Rodack, LLP

(57) ABSTRACT

A voltage controlled oscillator including a control signal adjuster and ring-connected delay cells is disclosed. The control signal adjuster receives a first control signal to generate a second control signal boosted from the first control signal when the first control signal is lower than a transistor threshold voltage. The ring-connected delay cells are controlled by the first and second control signals both to generate an oscillation signal. Each of the delay cells has a first set of current generation transistors and a second set of current generation transistors. Each transistor of the first set of current generation transistors has a control terminal receiving the first control signal while each transistor of the second set of current generation transistors has a control terminal receiving the second control signal. The first and second sets of current generation transistors collectively output an oscillation signal with unchanged frequency of associated input signal.

15 Claims, 5 Drawing Sheets

VOLTAGE CONTROLLED OSCILLATOR

CROSS REFERENCE TO RELATED APPLICATIONS

This application claims priority of Taiwan Patent Application No. 099145760, filed on Dec. 24, 2010, the entirety of which is incorporated by reference herein.

BACKGROUND OF THE INVENTION

1. Field of the Invention

The present invention relates to voltage controlled oscillators.

2. Description of the Related Art

A voltage controlled oscillator (VCO) is generally controlled by a voltage input to modify the oscillation frequency of a generated oscillation signal.

In conventional VCO circuits, the voltage input has to be great enough to trigger oscillation. FIG. 1 shows a relationship between a voltage input VCNT and an oscillation frequency fout of a conventional VCO circuit. As shown, when the voltage input VCNT is within a silent region 102, the VCO is silent and the oscillation frequency fout is zero.

BRIEF SUMMARY OF THE INVENTION

A voltage controlled oscillator in accordance with an exemplary embodiment of the invention comprises a control signal adjuster and a plurality of delay cells that are ring-connected. The control signal adjuster receives a first control signal to generate a second control signal. In a case wherein the voltage level of the first control signal is lower than a transistor threshold voltage, the second control signal is generated, which is boosted from the first control signal. The ring-connected delay cells are controlled by the first and the second control signals both to generate an oscillation signal.

The delay cells each comprise a first set of current generation transistors and a second set of current generation transistors. In the first set of current generation transistors, each transistor provides a control terminal to receive the first control signal. In the second set of current generation transistors, each transistor provides a control terminal to receive the second control signal. The first and second sets of the current generation transistors collectively output an oscillation signal with unchanged frequency of associated input signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 2:
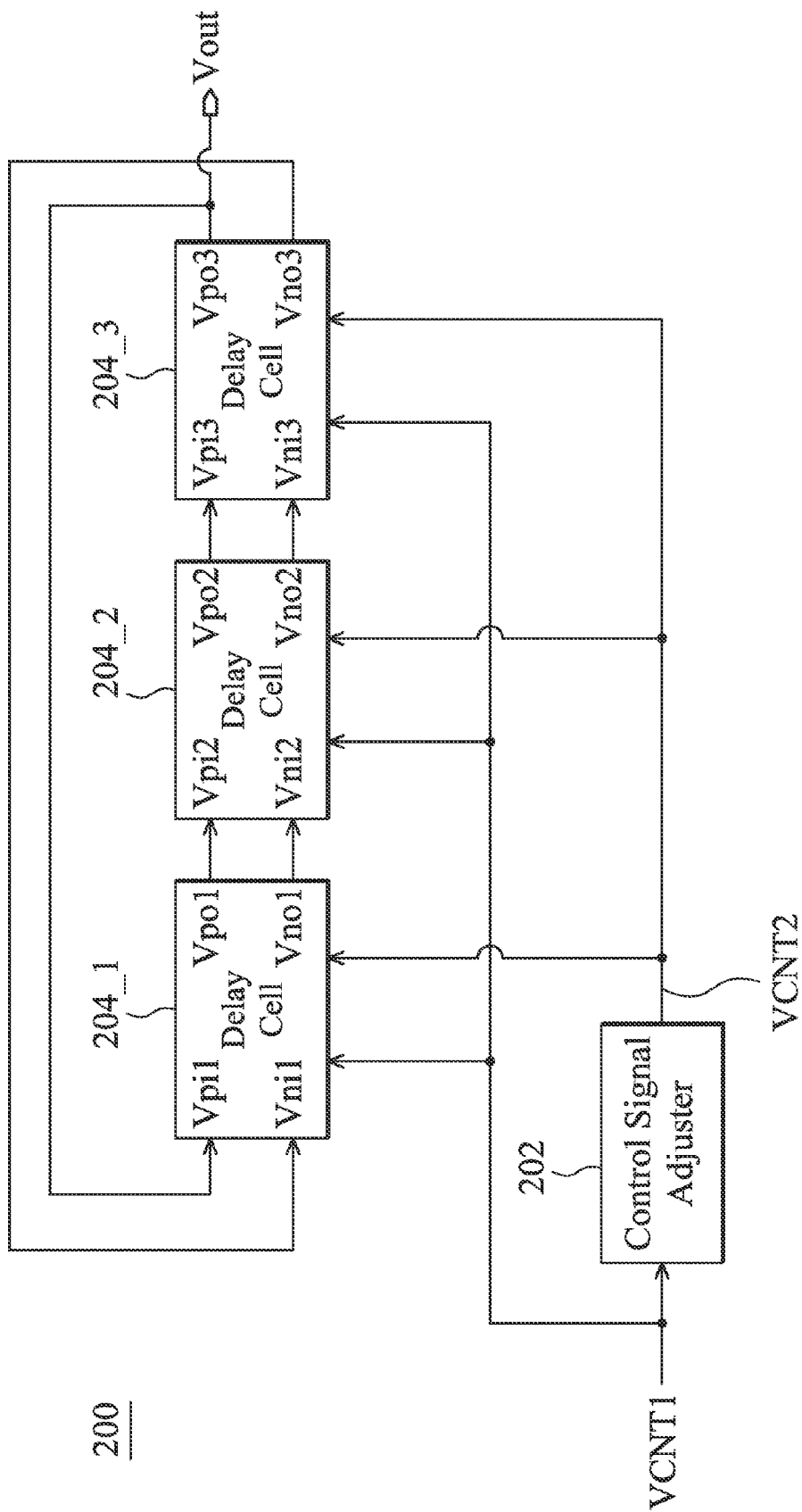
FIG. 2 shows a block diagram illustrating a voltage controlled oscillator 200 in accordance with an exemplary embodiment of the invention.

FIG. 2 shows a block diagram illustrating a voltage controlled oscillator 200 in accordance with an exemplary embodiment of the invention. The voltage controlled oscillator 200 comprises a control signal adjuster 202 and a plurality of delay cells 204_1-204_3. The delay cells 204_1-204_3 are ring-connected.

The control signal adjuster 202 receives a first control signal VCNT1 to generate a second control signal VCNT2. If the first control signal VCNT1 is lower than a transistor threshold voltage, the voltage level of the first control signal VCNT1 is boosted to a higher level to generate the second control signal VCNT2.

Under the control of both of the first and second control signals VCNT1 and VCNT2, an oscillation signal Vout is generated by the plurality of delay cells 204_1 to 204_3. The disclosed delay cells 204_1 to 204_3 are distinct from the conventional ones. Each of the disclosed delay cells 204_1 to 204_3 is controlled by the first control signal VCNT1 as well the second control signal VCNT2. For example, each delay cell contains two sets of current generation transistors. In the first set of current generation transistors, each transistor provides one control terminal to receive the first control signal VCNT1. In the second set of current generation transistors, each transistor provides one control terminal to receive the second control signal VCNT2. The first set and the second set of current generation transistors collectively output an oscillation signal with unchanged frequency in comparison with the oscillation signal Vout.

Figure 3:
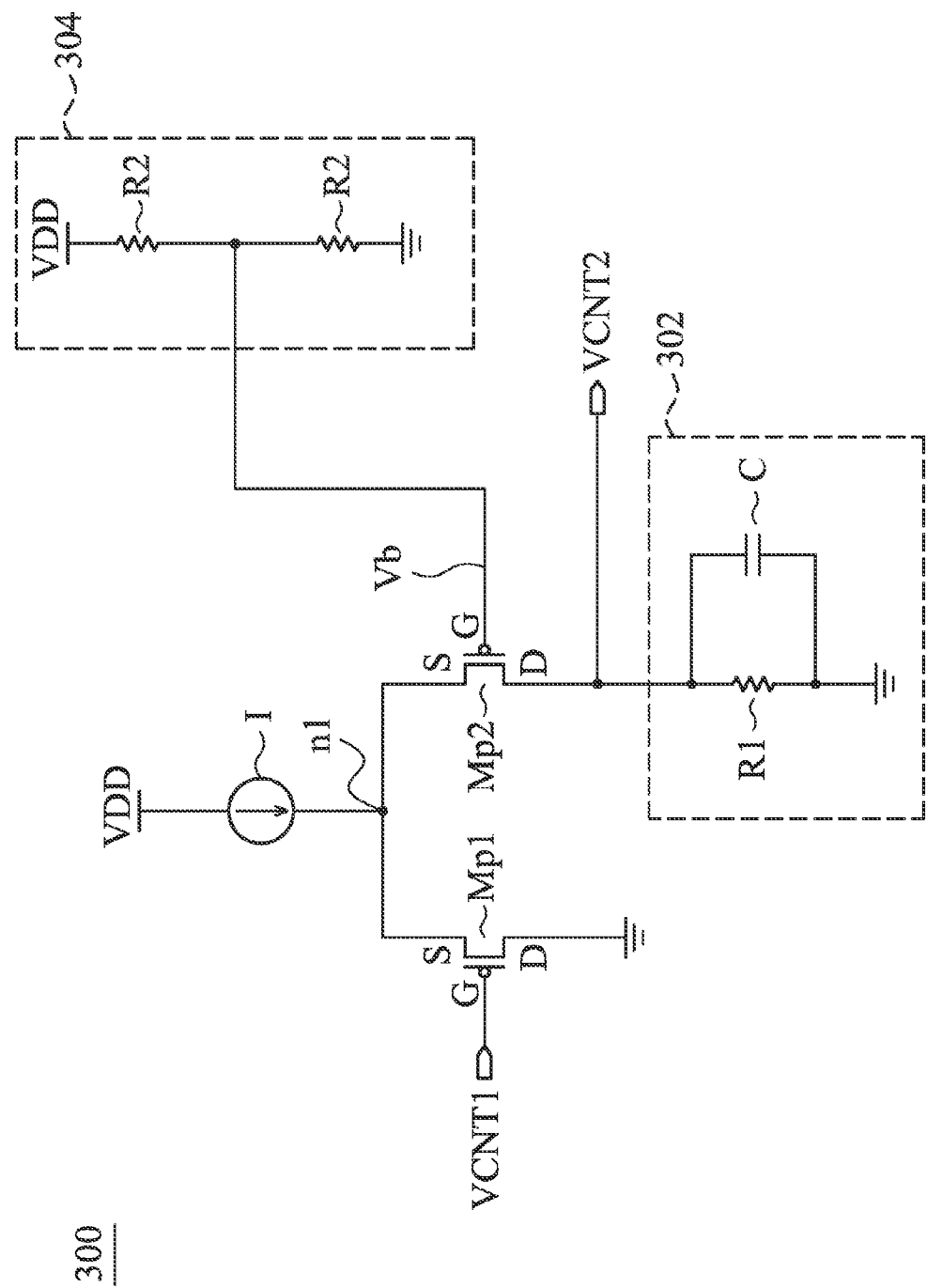
FIG. 3 illustrates an exemplary embodiment of the control signal adjuster 202 of FIG. 2.

FIG. 3 illustrates an exemplary embodiment of the control signal adjuster 202 of FIG. 2. As shown, the control signal adjuster 300 comprises a current source I, a first P-channel transistor Mp1, a second P-channel transistor Mp2 and a current-to-voltage conversion unit 302. The first P-channel transistor Mp1 has a source S coupled to an output terminal n1 of the current source I, a drain D grounded, and a gate G coupled to receive the first control signal VCNT1. The second P-channel transistor Mp2 has a source S coupled to the output terminal n1 of the current source I, a gate G controlled by a bias circuit 304, and a drain D. The current-to-voltage conversion unit 302 is operative to convert a current output from the drain D of the second P-channel transistor Mp2 to the second control signal VCNT2.

In the exemplary embodiment of FIG. 3, the current-to-voltage conversion unit 302 comprises a resistor R1 coupled at the drain D of the second P-channel transistor Mp2, wherein another terminal of the resistor R1 is grounded. The voltage difference across the resistor R1 is regarded as the second control signal VCNT2. In FIG. 3, the current-to-voltage conversion unit 302 further comprises an optional component, a capacitor C. As shown, one terminal of the capacitor C is coupled to the drain D of the second P-channel transistor Mp2 while another terminal of the capacitor C is coupled to the ground. The capacitor C is designed for voltage regulation.

The bias circuit 304 is operative to control the conduction of the second P-channel transistor Mp2. As shown, in the case wherein the current source I is powered by a voltage source VDD, the bias circuit 304 may be implemented by a voltage divider which uses two equivalent resistors (both labeled as R2) to halve the voltage source VDD to obtain a voltage level VDD/2 as the bias voltage Vb. The bias voltage Vb is applied at the gate G of the second P-channel transistor Mp2 to permanently turn on the second P-channel transistor Mp2.

In other embodiments, more than two resistors may be used in the bias circuit 304, and the current intensity of the current source I, the resistance of the resistor R1, the capacitance of the capacitor C and the value of the bias voltage Vb may be modified by a designer. The design concept of the control signal adjuster is: to ensure that the second control signal VCNT2 (converted from the current output from the drain D of the second P-channel transistor Mp2) is at a voltage level greater than that of the first control signal VCNT1 when the first control signal VCNT1 is lower than a transistor threshold voltage.

Note that the structure of the control signal adjuster 300 is not intended to limit the scope of the invention but just to provide an illustration. Any circuit or module capable of generating a second control signal VCNT2 having a voltage level greater than that of the first control signal VCNT1 when the voltage level of the first control signal VCNT1 is lower than the transistor threshold voltage is suitable for implementation of the disclosure.

Figure 4:
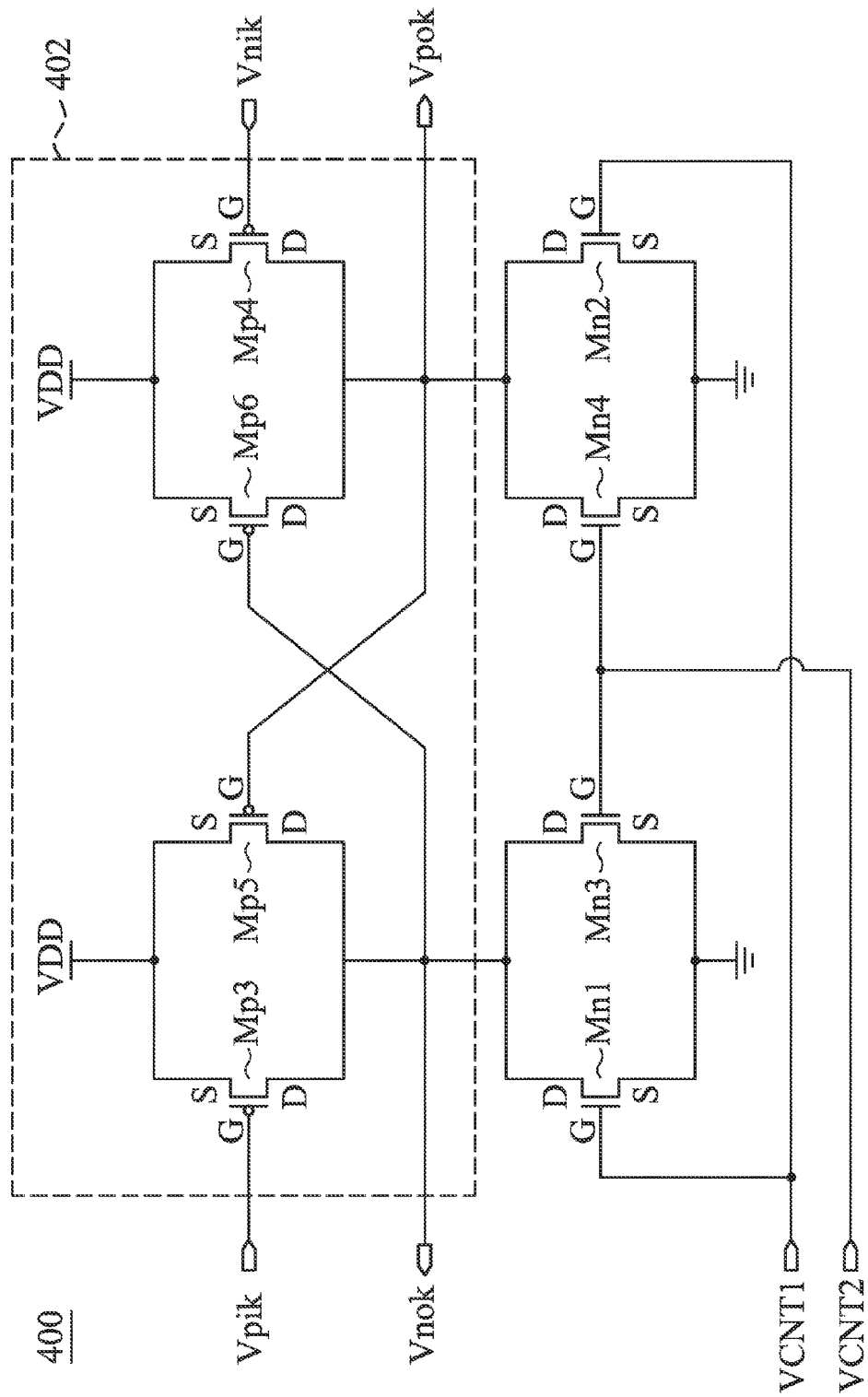
FIG. 4 depicts an exemplary embodiment of the delay cell (204_1, 204_2 or 204_3) of FIG. 2.

FIG. 4 depicts an exemplary embodiment of the delay cell (204_1, 204_2 or 204_3) of FIG. 2. One single delay cell is shown in FIG. 4. The delay cell 400, of a differential structure, may be named a differential delay cell. The circuit shown in FIG. 4 may be implemented at any stage of the ring-connected delay cells. In the following description, k, an integer, represents the stage number of the delay cell.

The delay cell 400 of FIG. 4 comprises a differential input/output circuit 402. The differential input/output circuit 402 comprises a third P-channel transistor Mp3, a fourth P-channel transistor Mp4, a fifth P-channel transistor Mp5 and a sixth P-channel transistor Mph. The third P-channel transistor Mp3 has a gate G working as a first differential input terminal Vpik (where k represents the stage number of the delay cell), a source S coupled to the voltage source VDD, and a drain D. The fourth P-channel transistor Mp4 has a gate G working as a second differential input terminal Vnik (where k represents the stage number of the delay cell), a source S coupled to the voltage source VDD and a drain D. The fifth P-channel transistor Mp5 has a gate G coupled to the drain D of the fourth P-channel transistor Mp4 and working as a first differential output terminal Vpok (where k represents the stage number of the delay cell), a source S coupled to the voltage source VDD, and a drain D coupled to the drain D of the third P-channel transistor Mp3. The sixth P-channel transistor Mp6 has a gate G coupled to the drain D of the third P-channel transistor Mp3 and working as a second differential output terminal Vnok, a source S coupled to the voltage source VDD, and a drain D coupled to the drain D of the fourth P-channel transistor Mp4.

In a ring-connected structure, the first and second differential output terminals of each delay cell are coupled to the first and second differential input terminals of the delay cell in the next stage. For example, referring to FIG. 2, the first and second differential input terminals Vpi1 and Vni1 of the delay cell 204_1 receive the signals from the first and second differential output terminals Vpo3 and Vno3 of the delay cell 204_3, the first and second differential input terminals Vpi2 and Vni2 of the delay cell 204_2 receive the signals from the first and second differential output terminals Vpo1 and Vno1 of the delay cell 204_1, and the first and second differential input terminals Vpi3 and Vni3 of the delay cell 204_3 receive the signals from the first and second differential output terminals Vpo2 and Vno2 of the delay cell 2042. In the ring-connected structure of FIG. 2, the oscillation signal Vout is provided at the first differential output terminal Vpo3 of the delay cell 204_3. Note that the amount of the delay cells utilized in a ring-connected structure is not limited to 3. More delay cells may be utilized in forming the ring-connected structure.

Referring to the delay cell 400 of FIG. 4, the drains (D) of the third, fourth, fifth and sixth P-channel transistors Mp3, Mp4, Mp5 and Mp6 are further connected to the first set and second sets of the current generation transistors, as detailed in the following paragraphs.

In the delay cell 400, a first N-channel transistor Mn1 and a second N-channel transistor Mn2 form a first set of current generation transistors, while a third N-channel transistor Mn3 and a fourth N-channel transistor Mn4 form the second set of current generation transistors.

This paragraph describes one structure for the first set of current generation transistors. The first N-channel transistor Mn1 has a gate G receiving the first control signal VCNT1, a source S which is grounded, and a drain D coupled to the drains (D) of the third and fifth P-channel transistors Mp3 and Mp5. The second N-channel transistor Mn2 has a gate G receiving the first control signal VCNT1, a source S which is grounded, and a drain D coupled to the drains (D) of the fourth and sixth P-channel transistors Mp4 and Mp6. According to the first control signal VCNT1, the first and second N-channel transistors Mn1 and Mn2 contribute to the current charging/discharging of the parasitic capacitors of the delay cell 400, and thereby output an oscillation signal (Vout of FIG. 2) generated by the ring-connected structure, with unchanged frequency of associated input signal.

This paragraph describes one structure for the second set of current generation transistors. The third N-channel transistor Mn3 has a gate G receiving the second control signal VCNT2, a source S which is grounded, and a drain D coupled to the drains (D) of the third and fifth P-channel transistors Mp3 and Mp5. The fourth N-channel transistor Mn4 has a gate G receiving the second control signal VCNT2, a source S which is grounded, and a drain D coupled to the drains (D) of the fourth and sixth P-channel transistors Mp4 and Mp6. According to the second control signal VCNT2, the third and the fourth N-channel transistors Mn3 and Mn4 contribute to the current charging/discharging of the parasitic capacitors of the delay cell 400, and thereby output an oscillation signal (Vout of FIG. 2) generated by the ring-connected structure, with unchanged frequency in comparison with associated input signal.

Figure 1:
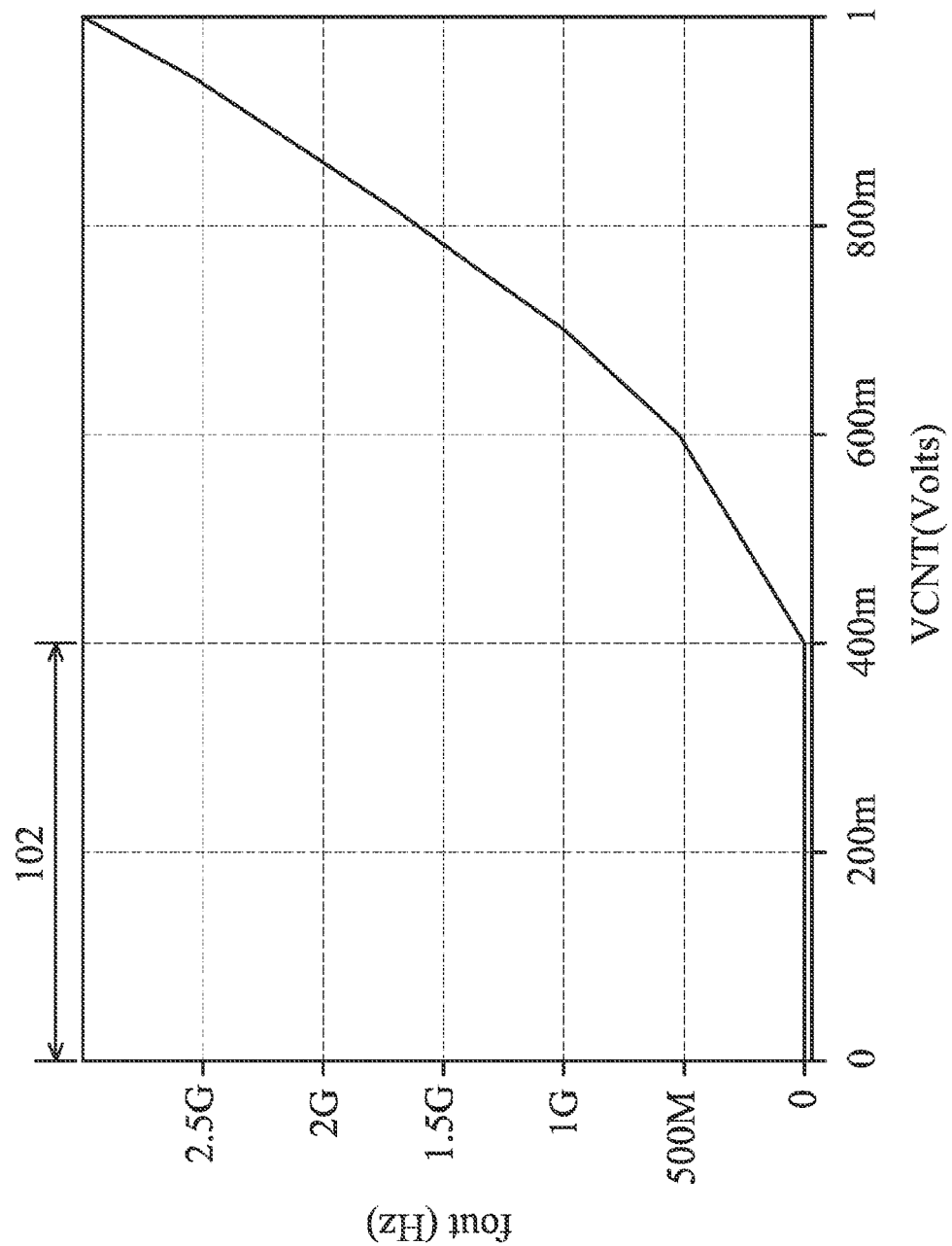
FIG. 1 shows a relationship between a voltage input VCNT and an oscillation frequency fout of a conventional VCO circuit.
Figure 5:
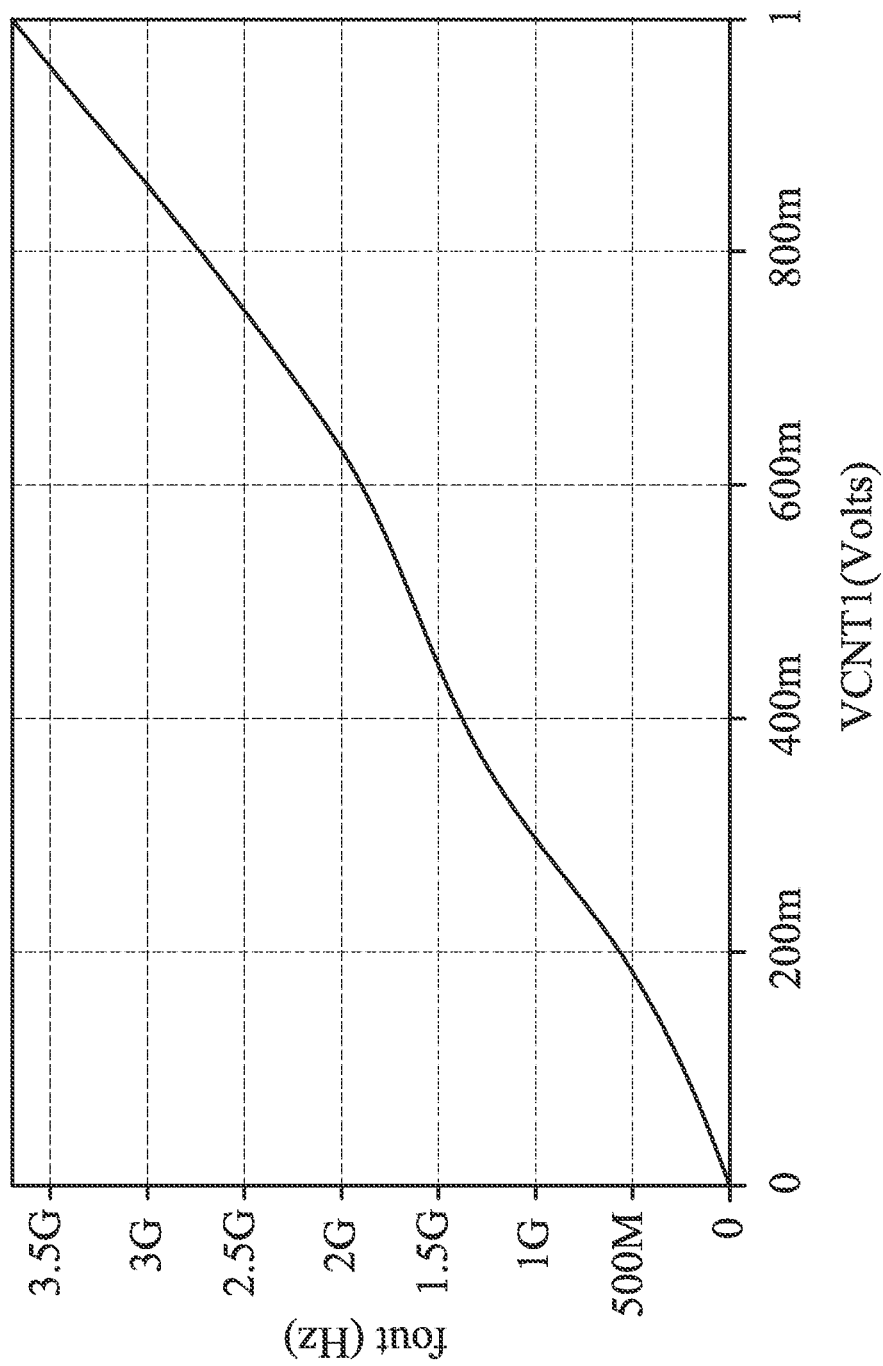
FIG. 5 relates to an exemplary embodiment of the VCOs of the invention, which illustrates a relationship between a first control signal VCNT1 and an oscillation frequency fout of an oscillation signal Vout generated by the disclosed VCO.

For the delay cell 400 of FIG. 4, when the first control signal VCNT1 is too weak to turn on the first set of current generation transistors (including the first and second N-channel transistors Mn1 and Mn2), the delay cell 400 is still functional since the second control signal VCNT2 boosted from the first control signal VCNT1 is high enough to turn on the second set of current generation transistors (including the third and the fourth N-channel transistors Mn3 and Mn4). The silent region 102 shown in FIG. 1 is eliminated in the disclosure of the invention. FIG. 5 relates to an exemplary embodiment of the VCOs of the invention, which illustrates a relationship between a first control signal VCNT1 and an oscillation frequency fout of an oscillation signal Vout generated by the disclosed VCO. In comparison with FIG. 1, the silent region 102 of FIG. 1 is eliminated in FIG. 5. The VCOs disclosed in the invention perform well in low operating voltage environments. Additionally, transistor threshold becomes a critical issue for those circuits made by advanced process technologies because they will work under low power supply operation with reduced supply voltage. Advantageously, the disclosed linearization VCO circuit is capable of providing output signal with unchanged frequency even if associated input voltage is below transistor threshold. Accordingly, the disclosed linearization VCO circuit is advantageously adaptive to all kinds of rail-to-rail input circuits receiving input signal with full range of power supply. Furthermore, the relationship between the first control signal VCNT1 and the oscillation frequency fout is almost linear. In comparison with conventional VCOs, the VCOs of the invention considerably suppress the jitter of the oscillation signal Vout.

Note that the differential design of the delay cells is not intended to limit the scope of the invention. Modifications may be made on any delay cell without departing from the spirit of the disclosed embodiments to achieve the same purpose.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage controlled oscillator generating an oscillation signal according to a first control signal, comprising:
   a control signal adjuster, receiving the first control signal and generating a second control signal according to the first control signal, wherein the second control signal generated to be higher than a voltage level of the first control signal when the voltage level of the first control signal is lower than a transistor threshold voltage; and
   a plurality of delay cells, ring-connected and controlled by the first and the second control signals to generate the oscillation signal, wherein each delay cell comprises:
   a first set of current generation transistors, wherein each transistor provides a control terminal to receive the first control signal; and
   a second set of current generation transistors, wherein each transistor provides a control terminal to receive the second control signal,
   wherein when the voltage level of the first control signal is too low to turn on the first set of current generation transistors, the second control signal turns on the second set of current generation transistors.

2. The voltage controlled oscillator as claimed in claim 1, wherein the control signal adjuster comprises:
   a first P-channel transistor, having a source coupled to a current source, a drain coupled to ground, and a gate coupled to the first control signal;
   a second P-channel transistor, having a source coupled to the current source, a gate coupled to a bias voltage, and a drain; and
   a current-to-voltage conversion unit, converting a current output from the drain of the second P-channel transistor to generate the second control signal.

3. The voltage controlled oscillator as claimed in claim 2, wherein the current-to-voltage conversion unit comprises a resistor having a first terminal coupled to the drain of the second P-channel transistor and a second terminal coupled to the ground, wherein the first terminal of the resistor outputs the second control signal.

4. The voltage controlled oscillator as claimed in claim 2, wherein the current-to-voltage conversion unit comprises a capacitor, and the capacitor has a first terminal coupled to the drain of the second P-channel transistor and has a second terminal coupled to the ground.

5. The voltage controlled oscillator as claimed in claim 2, wherein the bias voltage is generated to keep the second P-channel transistor turned on.

6. The voltage controlled oscillator as claimed in claim 2, wherein:
   the current source is coupled to a voltage source; and
   the bias voltage is generated by a bias circuit comprising a voltage divider, wherein the voltage divider generates a bias voltage level half of the voltage source to bias the gate of the second P-channel transistor.

7. The voltage controlled oscillator as claimed in claim 1, wherein each of the delay cells further comprises a differential input/output circuit coupled to the first and second sets of current generation transistors, wherein the differential input/output circuit comprises:
   a third P-channel transistor, having a gate working as a first differential input terminal, a source coupled to a voltage source, and a drain;
   a fourth P-channel transistor, having a gate working as a second differential input terminal, a source coupled to the voltage source, and a drain;
   a fifth P-channel transistor, having a gate coupled to the drain of the fourth P-channel transistor to work as a first differential output terminal, a source coupled to the voltage source, and a drain coupled to the drain of the third P-channel transistor; and
   a sixth P-channel transistor, having a gate coupled to the drain of the third P-channel transistor to work as a second differential output terminal, a source coupled to the voltage source, and a drain coupled to the drain of the fourth P-channel transistor.

8. The voltage controlled oscillator as claimed in claim 7, wherein:
   the first set of current generation transistors of each delay cell comprises:
   a first N-channel transistor, having a gate receiving the first control signal, a source coupled to ground, and a drain coupled to the drains of the third and the fifth P-channel transistors; and
   a second N-channel transistor, having a gate receiving the first control signal, a source coupled to the ground, and a drain coupled to the drains of the fourth and the sixth P-channel transistors; and
   the second set of current generation transistors of each delay cell comprises:
   a third N-channel transistor, having a gate receiving the second control signal, a source coupled to the ground, and a drain coupled to the drains of the third and the fifth P-channel transistors; and
   a fourth N-channel transistor, having a gate receiving the second control signal, a source coupled to the ground, and a drain coupled to the drains of the fourth and the sixth P-channel transistors.

9. The voltage controlled oscillator as claimed in claim 7, wherein, for each delay cells, the first and the second differential output terminals thereof are coupled to the first and the second differential input terminals of a next delay cell.

10. A voltage controlled oscillator generating an oscillation signal according to a first control signal, comprising:
    a control signal adjuster, receiving a first control signal and generating a second control signal according to the first control signal, wherein a voltage level of the second control signal is generated to be higher than a voltage level of the first control signal when the voltage level of the first control signal is lower than a transistor threshold voltage; and a plurality of ring-connected delay cells, receiving the first and the second control signals to generate the oscillation signal at a first differential output terminal of one of the plurality of the ring-connected delay cells, wherein, for each ring-connected delay cell, the first differential output terminal and a second differential output terminals thereof are coupled to a first differential input terminal and a second differential input terminals of a next ring-connected delay cells, wherein when the first control signal is lower than the transistor threshold voltage, the ring-connected delay cells are operated by the second control signal.

11. The voltage controlled oscillator as claimed in claim 10, wherein each of the ring-connected delay cells comprises:

a first set of current generation transistors, wherein each of the first set of the current generation transistors provides a control terminal to receive the first control signal; and a second set of current generation transistors, wherein each of the second set of the current generation transistors provides a control terminal to receive the second control signal, wherein when the voltage level of the first control signal is too low to turn on the first set of current generation transistors, the second control signal turns on the second set of current generation transistors.

12. The voltage controlled oscillator as claimed in claim 11, wherein each of the ring-connected delay cells comprises a differential input/output circuit coupled to the first and second sets of current generation transistors, wherein the differential input/output circuit comprises:

a third transistor, having a gate working as the first differential input terminal, a source coupled to a voltage source, and a drain;

a fourth transistor, having a gate working as the second differential input terminal, a source coupled to the voltage source, and a drain;

a fifth transistor, having a gate coupled to the drain of the fourth transistor to work as the first differential output terminal, a source coupled to the voltage source, and a drain coupled to the drain of the third transistor; and a sixth transistor, having a gate coupled to the drain of the third transistor to work as the second differential output terminal, a source coupled to the voltage source, and a drain coupled to the drain of the fourth transistor.

13. The voltage controlled oscillator as claimed in claim 12, wherein:

the first set of current generation transistors of each delay cell comprises:

a first current generation transistor, having a gate receiving the first control signal, a source coupled to a reference voltage, and a drain coupled to the drains of the third and the fifth transistors; and a second current generation transistor, having a gate receiving the first control signal, a source coupled to the reference voltage, and a drain coupled to the drains of the fourth and the sixth transistors; and the second set of current generation transistors of each delay cell comprises:

a third current generation transistor, having a gate receiving the second control signal, a source coupled to the reference voltage, and a drain coupled to the drains of the third and the fifth transistors; and a fourth current generation transistor, having a gate receiving the second control signal, a source coupled to the reference voltage, and a drain coupled to the drains of the fourth and the sixth transistors.

14. The voltage controlled oscillator as claimed in claim 10, wherein the control signal adjuster comprises:

a first transistor, having a source coupled to a current source, a drain coupled to a reference voltage, and a gate coupled to the first control signal;

a second transistor, having a source coupled to the current source, a gate receiving a bias voltage, and a drain, wherein the bias voltage turns on the second transistor; and a current-to-voltage conversion unit, converting a current output from the drain of the second transistor to generate the second control signal.

15. The voltage controlled oscillator as claimed in claim 14, wherein the current-to-voltage conversion unit comprises a resistor having a first terminal coupled to the drain of the second transistor and a second terminal coupled to the reference voltage, wherein the first terminal of the resistor outputs the second control signal.

* * * * *